United States Patent [19]

Noriyuki

[11] Patent Number: 5,070,389
[45] Date of Patent: Dec. 3, 1991

[54] IC REMOVING MECHANISM IN IC SOCKET

[75] Inventor: Matsuoka Noriyuki, Tokyo, Japan

[73] Assignee: Yamaichi Electric Mfg. Co., Ltd., Tokyo, Japan

[21] Appl. No.: 497,079

[22] Filed: Mar. 21, 1990

[30] Foreign Application Priority Data

Mar. 23, 1989 [JP] Japan ................................. 1-72350

[51] Int. Cl.⁵ ............................................ H05K 1/00
[52] U.S. Cl. ................................... 357/68; 439/68; 439/152; 439/71; 357/74; 357/79
[58] Field of Search ............... 357/74, 79, 68; 439/68, 439/71, 152

[56] References Cited

U.S. PATENT DOCUMENTS

| 4,447,101 | 5/1984 | Gugliotti | 439/153 |
| 4,579,408 | 4/1986 | Sasaki | 439/153 |
| 4,623,208 | 11/1986 | Kerul et al. | 439/71 |
| 4,657,328 | 4/1987 | Matsuoka | 439/68 |
| 4,686,468 | 8/1987 | Lee et al. | 439/68 |
| 4,750,890 | 6/1988 | Dube et al. | 439/70 |
| 4,758,176 | 7/1988 | Abe et al. | 439/73 |
| 4,789,345 | 12/1988 | Carter | 439/71 |
| 4,832,610 | 5/1989 | Matsuoka | 439/68 |

FOREIGN PATENT DOCUMENTS

| 3636677 | 5/1987 | Fed. Rep. of Germany | 439/68 |
| 63-301476 | 12/1958 | Japan . | |
| 59-57462 | 4/1984 | Japan . | |
| 63-2275 | 1/1988 | Japan . | |

Primary Examiner—Andrew J. James
Assistant Examiner—Viet Q. Nguyen
Attorney, Agent, or Firm—Wenderoth, Lind & Ponack

[57] ABSTRACT

An IC socket has an IC accommodating portion, at least one ejection lever disposed in the IC accommodating portion, and a socket board for supporting a generally central portion of the lever in such a manner as to be able to effect a seesaw motion. An IC is supported by a push-up lever portion on one end of the lever for effecting the seesaw motion. A push-down force is exerted on the push-down lever portion on the other end for effecting a seesaw motion of the lever, thereby to move up the push-up lever portion on the one end in order to push up the IC. The IC socket is characterized in that the push-up lever portion is provided with a small projection on a lower surface of the push-up lever portion and a cone-shaped concave portion is formed at a position corresponding to the small production in the socket board so that the lever is correctly positioned with respect to the socket board.

1 Claim, 7 Drawing Sheets

IC REMOVING MECHANISM IN IC SOCKET

BACKGROUND OF THE INVENTION

1. Field of the Invention

This invention relates to an IC removing mechanism in an IC socket by which an integrated circuit can be easily removed from the IC socket.

2. Brief Description of the Prior Art

As is shown in FIGS. 8 and 9 (see Japanese Patent Early Laid-open Publication No. Sho 63-2275), a centrally fulcrumed ejection lever 3 is disposed in an IC accommodating portion 1a of a socket board 1 in such a fashion as to be horizontally symmetric about the fulcrum, the lever 3 being supported on the socket board 1 at a supporting point A comprising an engaging groove 1c and a projecting supporting point 3a in such a manner as to be able to effect a seesaw motion, an IC 5 being supported by a push-up lever portion 3b which effects a seesaw motion on one end of the lever 3, a push-down force being exerted to a push-down lever portion 3b which effects a seesaw motion on the other end as shown in FIG. 8, thereby to raise the push-up lever portion 3b in order to raise the IC 5 to a higher position from a push-in position so that the IC 5 can be easily removed.

In recent years, this type of socket is often used in a state where the socket is placed upside down on a distributing board, etc. in processes for testing an IC 5 or the like.

In this case, according to the conventional socket, the idle supporting point A formed on a generally central portion of the lever is merely placed on the socket board 1 and not axially supported. Accordingly, when the socket is placed upside down, the projecting supporting point 3a of the lever 3, as shown in FIG. 10, is separated from the socket board 1. If the IC 5 is to be inserted in that state, the projecting supporting portion 3a of the lever 3, as shown in FIG. 11, is not received in the regular engaging groove 1c of the socket board 1. As a result, the IC 5 cannot be pushed into a fixed position.

SUMMARY OF THE PRESENT INVENTION

In order to overcome these inconveniences, the present invention is constructed such that the push-up portion of the ejection lever is provided with a small projection formed on a lower surface thereof and a cone-shaped concave portion is formed in a position corresponding to the socket board and adapted to receive the small projection therein, so that the ejection lever and the socket board can be correctly positioned.

According to the present invention, the small projection of the lever is always centripetally attracted toward the central portion of the cone-shaped inclined surface guided by the cone-shaped inclined surface of the concave portion. As a result, a proper alignment between the projecting supporting point forming the idle supporting point and the engaging groove is ensured. Therefore, even if the IC socket is placed upside down and a slight play is generated in the lever, a correct position of the lever can be ensured by the centripetal function caused by the cone-shaped concave portion and the small projection.

DETAILED DESCRIPTION OF THE INVENTION

Figure 1A:
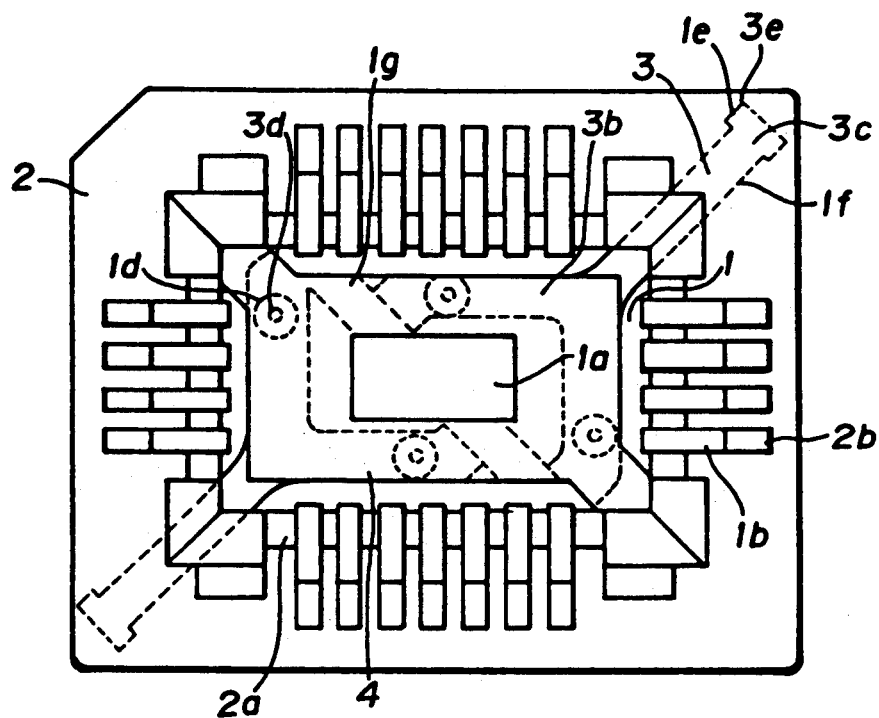
FIG. 1A is a plan view of an IC socket according to an embodiment of the present invention.
Figure 1B:
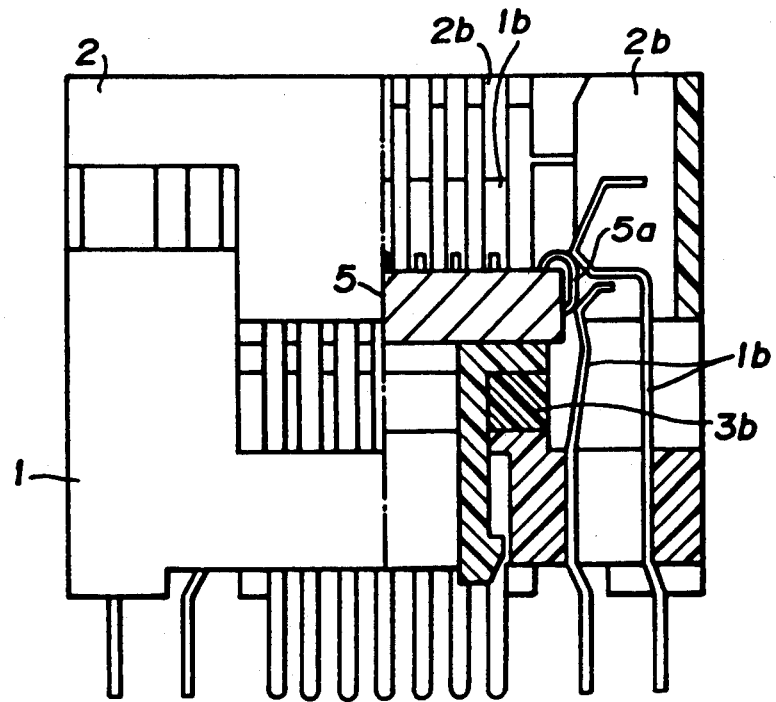
FIG. 1B is a side view, partly in section, of the socket of FIG. 1A.

The embodiment of the present invention will be described below with reference to FIGS. 1–7.

The reference numeral 1 denotes a socket board, 2 an IC accommodating framework, 3 an ejection lever, and 4 an IC supporting stage or platform.

The socket board 1 has a generally square IC accommodating portion 1a in its central portion and has a plurality of contacts 1b along four sides or two sides of the periphery of the IC accommodating portion 1a. A corner portion of the IC accommodating portion 1a where the row of contacts 1b along each side is discontinued is provided with the ejection lever 3 in such a manner as to be able to effect a seesaw motion. The contacts 1b and the leads 1a of the IC 5 are shown only in FIGS. 1A and 1B and are omitted from other drawings in order to facilitate an easy understanding.

The ejection lever 3 has an IC push-up lever portion 3b extending into an inner area in two parts, one along each side forming the corner of the IC accommodating portion 1a, and a push-down lever portion extends toward an outer part of the socket from the corner portion, a projecting supporting point 3a is formed at the central portion being snugly fitted in an engaging groove 1c formed in the corner portion of the IC accommodating portion 1a, the push-up lever portion 3b and the push-down lever portion 3c being subjected to seesaw motion with the aforementioned snug supporting point as the fulcrum A.

Figure 1C:
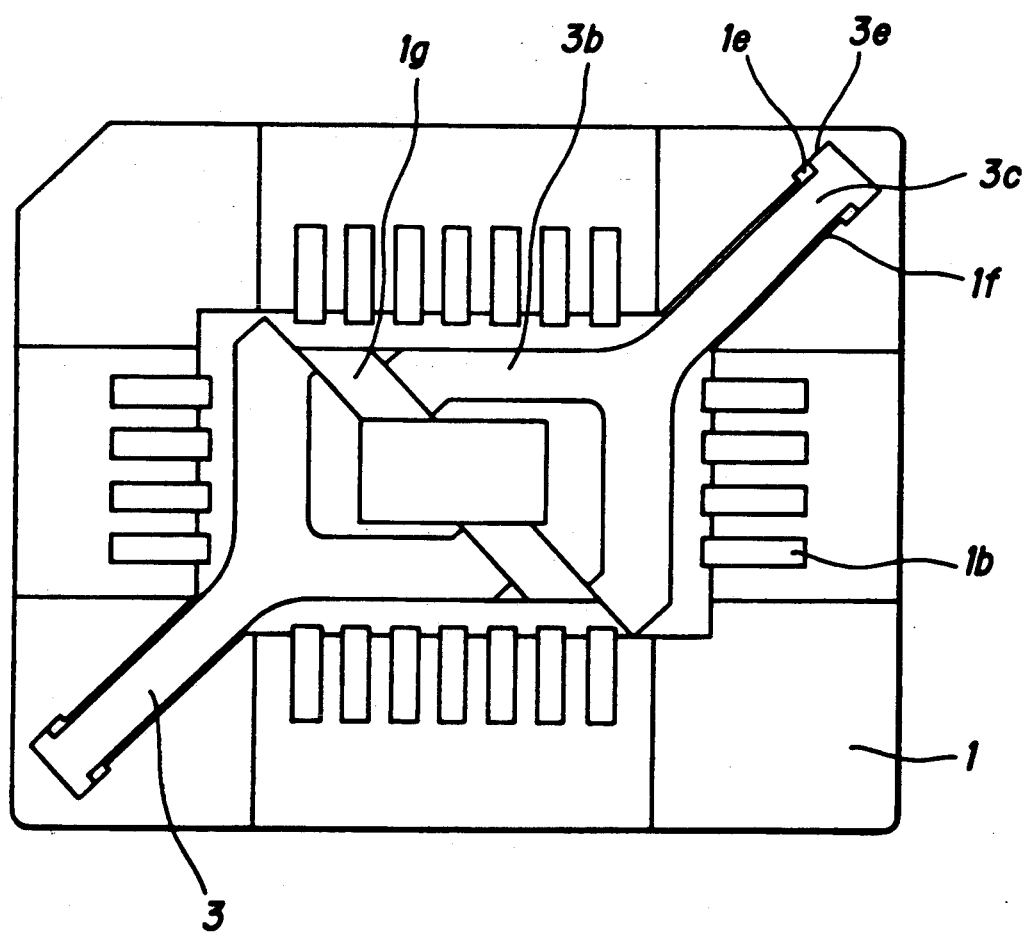
FIG. 1C is a plan view of a socket board from which an IC accommodating portion has been removed.

Each part of the push-up lever portion 3b is provided with a small projection 3d on its lower surface, while the socket board is provided with a cone-shaped concave portion 1d on its upper surface in a position corresponding to each small projection 3d, so that when the push-up lever portion 3b is pushed down, the small projections 3d are snugly fitted into the cone-shaped concave portions 1d to correctly position the ejection lever 3 on the socket board 1. Each small projection 3d is preferably formed in a circular cone shape having a shart tip. As is shown in FIG. 1C, a free end of the push-down lever portion 3c is provided with a positioning end portion 3e adapted to engage in a positioning groove 1e in a vertical position in the socket board opposite the free end and being movable upward and downward while being guided by the inner wall of the positioning groove 1e. By bringing the positioning end portion 3e and the positioning groove 1e into alignment with each other, the ejection lever 3 and the socket board 1 are roughly positioned.

The corner portion of the IC accommodating portion 1a where the ejection lever 3 is mounted is provided with a lever guide groove 1f formed along a generally diagonal line from the corner portion toward the outer part of the socket, the push-down lever portion 3c being fitted in the guide groove 1f, a bottom surface of the guide groove being inclined downwardly from the engaging groove 1c and acting as the supporting point portion toward the outer part of the socket so that the push-down of the push-down lever portion 3c is proper.

One pair of such levers 3 is provided and one of them is mounted at each corner on a diagonal line across the IC accommodating portion 1a, respectively. The bottom surface of the IC accommodating portion 1a is provided with a partition wall 1g for partitioning the pair of levers 3 and each lever 3 is regulated in the IC accommodating portion 1a.

An IC supporting platform 4 having the general configuration of the IC accommodating portion 1a is placed on the IC accommodating portions 3b of each lever disposed as described above, with the corner portions superposed on the push-up lever portions 3b. By this, each lever 3 supports the areas of the platform 4 where the parts of the push-up lever portions 3b extend along each corner forming side of the IC socket, so that the IC supporting platform 4 can be moved upward and downward in accordance with the seesaw motion of the ejection lever 3. That is, by pushing down the push-down lever portion 3c of the ejection levers 3, the push-up lever portions 3b are caused to move up to move the IC supporting platform 4 and the IC 5 placed thereon upward into a contact releasing position (see FIG. 2), and by pushing down the IC 5, the IC supporting platform is moved downward to cause the push-down lever portions 3c to move up so that the IC supporting platform is brought into a contacting position (see FIG. 3).

The IC accommodating framework 2 is attached to a thus constructed socket board 1.

The IC accommodating framework 2 has an IC accommodating portion 2a immediately above the IC accommodating portion 1a of the socket board 1, the IC accommodating portion 2a being provided with a plurality of contact receiving grooves 2b formed at four sides or two sides of the IC accommodating portion 2a and opened into the accommodating portion 2a, the IC accommodating framework 2 being attached to the socket board 1 in order to bring the IC accommodating portion 1a and the IC accommodating portion 2a to a mutually corresponding relation in the vertical direction, the contacts 1b being inserted into the contact receiving grooves 2b.

Furthermore, the push-down lever portion 3c of the levers 3 acting as means for exerting a push-down force allows the push-down element 2c to move down with the IC accommodating framework 2 so that the push-down element 2c is abutted against an upper surface of the end portion of the push-down lever portion 3c.

Figure 2:
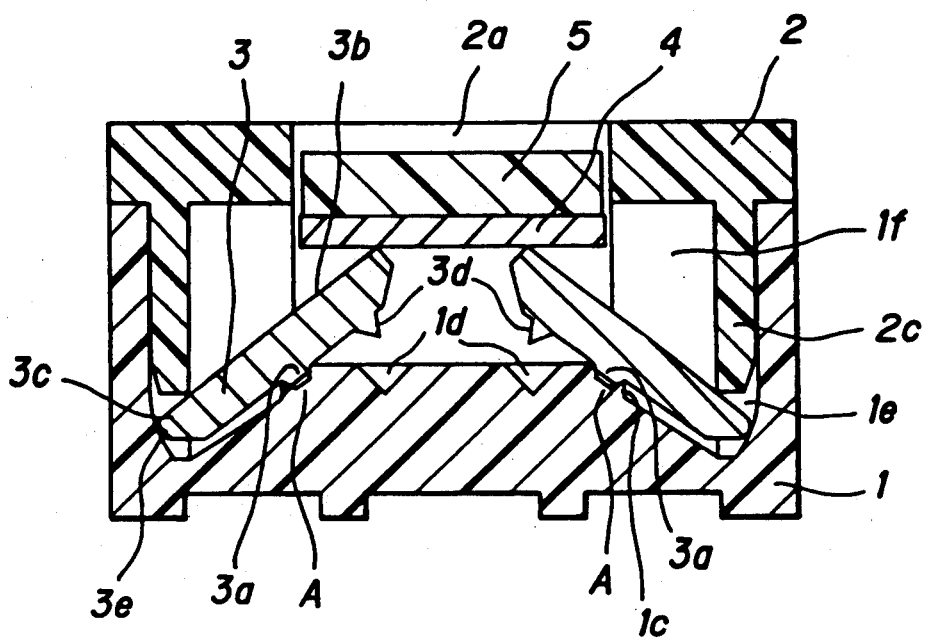
FIG. 2 is a section view of the socket of FIG. 1, in which the IC has been pushed up by a lever.

As is shown in FIG. 2, the IC accommodating framework 2 is in its pushed-down position at the time when the IC is to be inserted or removed. As a result, the push-down element 2c pushes the push-down portions 3c of the ejection levers 3 so that the push-down portions 3c are pivoted to move the push-up lever portions 3b to a state where the IC supporting platform 4 is moved upward into a higher position.

Figure 3:
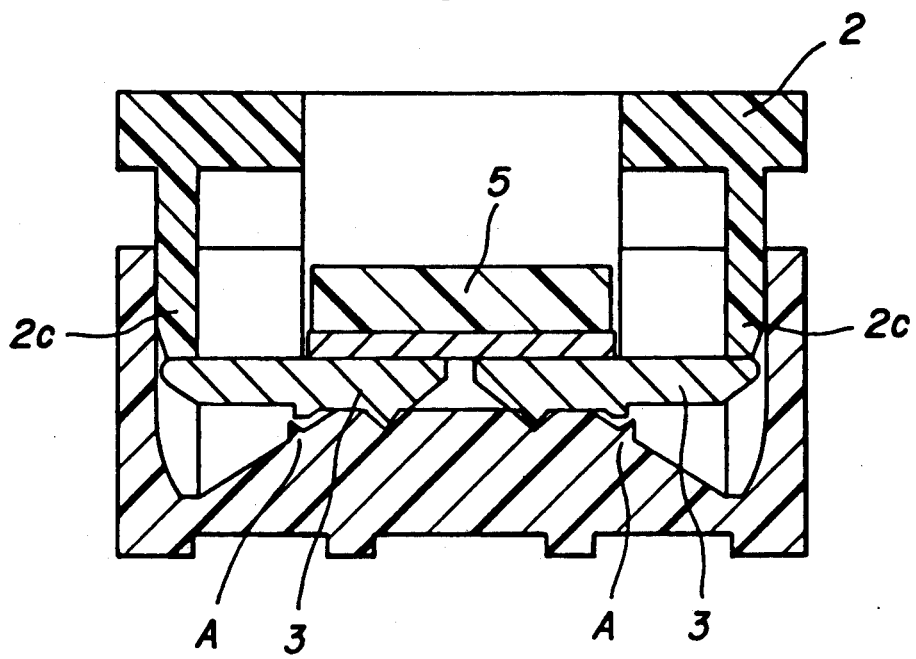
FIG. 3 is a section view thereof in which the IC has been pushed down by the lever.
Figure 3:

In the above-described state, the IC 5 is placed on the IC supporting platform 4 and a push-down force is exerted on the IC supporting platform 4. As a result, as is shown in FIG. 3, the IC supporting platform 4 causes the push-up lever portions 3b of the levers 3 to be pivoted downward to move the push-down lever portions 3c up as a reaction. At the same time, the IC supporting platform 4 pushes the pushdown element 2c of the IC accommodating framework 2 up to form a state where the framework 2 is pushed up into a higher position.

In the above-described state, the leads 5b on each of the side surfaces of the IC 5 are resiliently engaged by the contacts 1b from both sides thereof to achieve a pressure contact.

When the IC accommodating framework 2 is pushed down from the above-described state, the levers 3 effect the pivoting motion as previously described to push up the IC supporting platform 4 and the IC 5 placed thereon again into the higher position as shown in FIG. 2 while causing the leads 5a to be disengaged from the contacts 1b and produce the contact releasing state. In this state, the IC 5 can be easily removed from and placed on the IC supporting platform 4.

Next, there will be described a case where the socket is placed upside down with reference to FIGS. 4–7.

Figure 4:
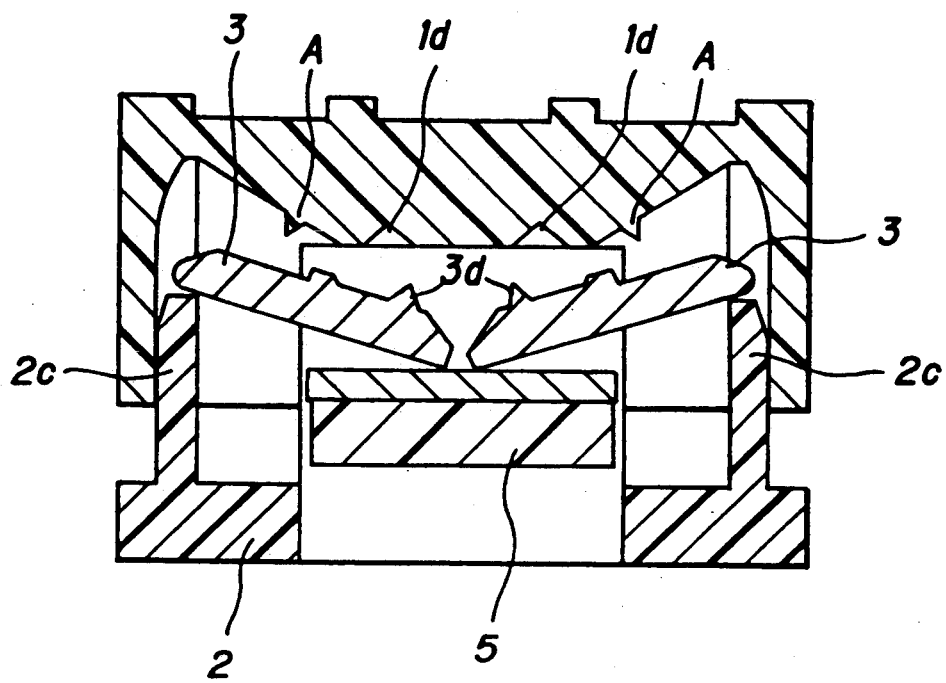
FIGS. 4–7 are sectional views of the socket showing the positioning of the fulcrumed lever in accordance with the push-up motion of the IC when the IC socket is placed upside down.
Figure 5:
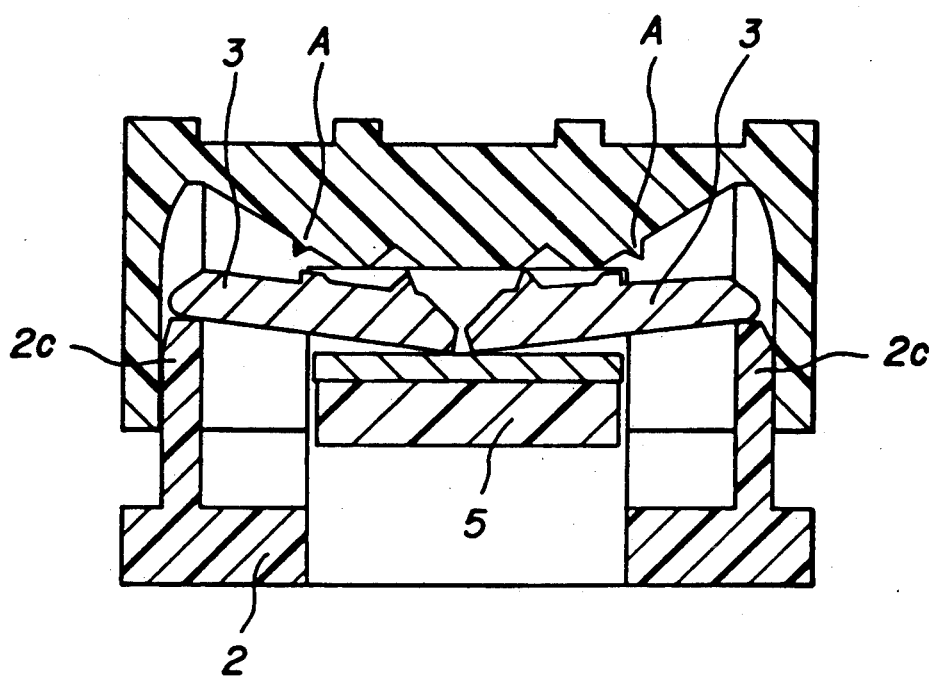
Figure 6:
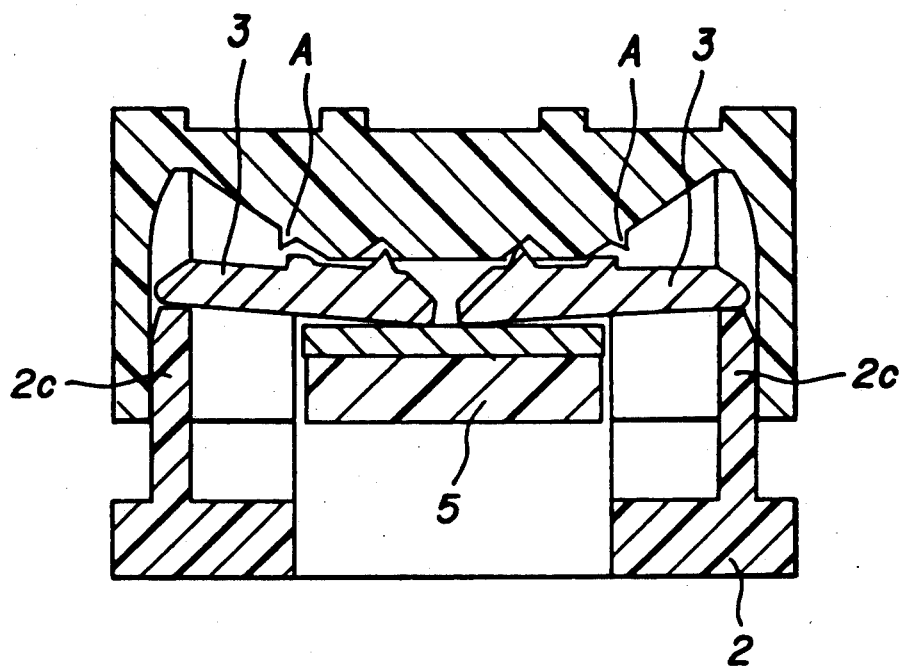

First, when the socket board 1 is placed upside down as shown in FIG. 4, the IC accommodating framework 2 and the IC supporting framework 4 are moved downward. As a result, the projecting supporting points 3a of the levers 3 are also separated from the engaging grooves 1c of the socket board 1 and the ends 3c rest on the push-down element 2c of the IC accommodating framework 2 and the ends 3b rest on the IC supporting platform 4.

Figure 7:
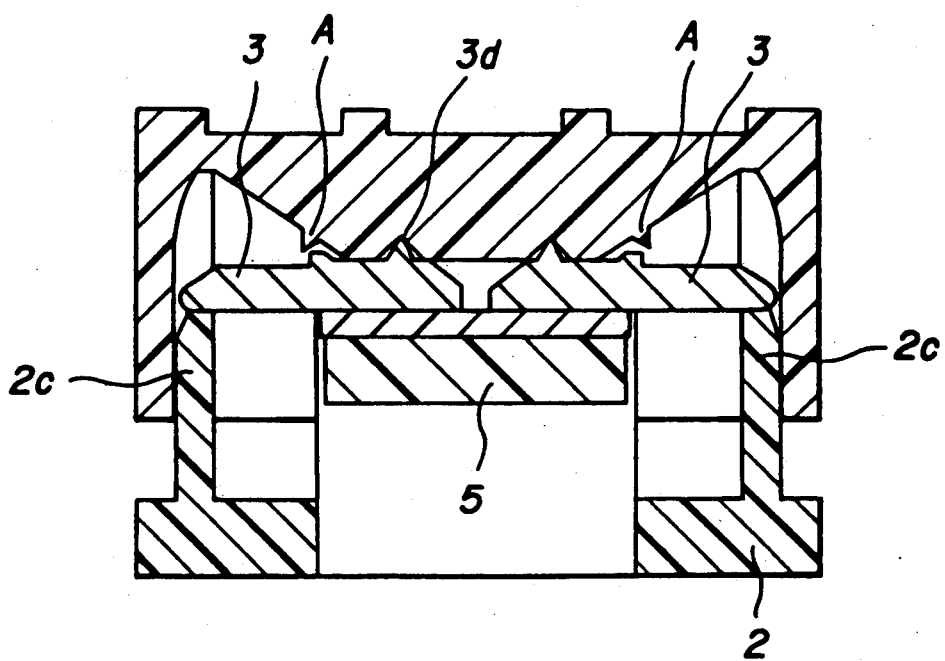
Figure 8:
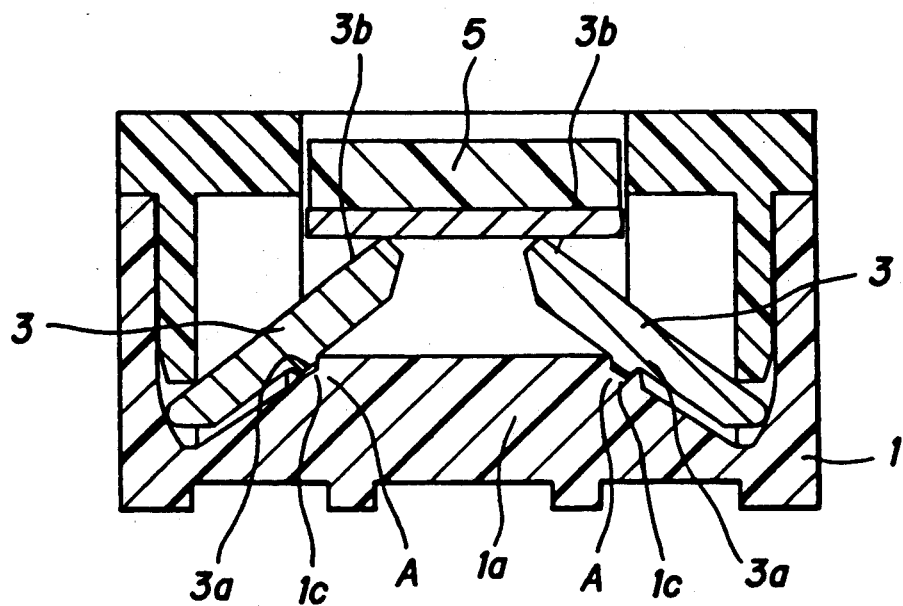
FIG. 8 is a sectional view of a conventional IC socket showing the IC in a non-contacted state.
Figure 9:
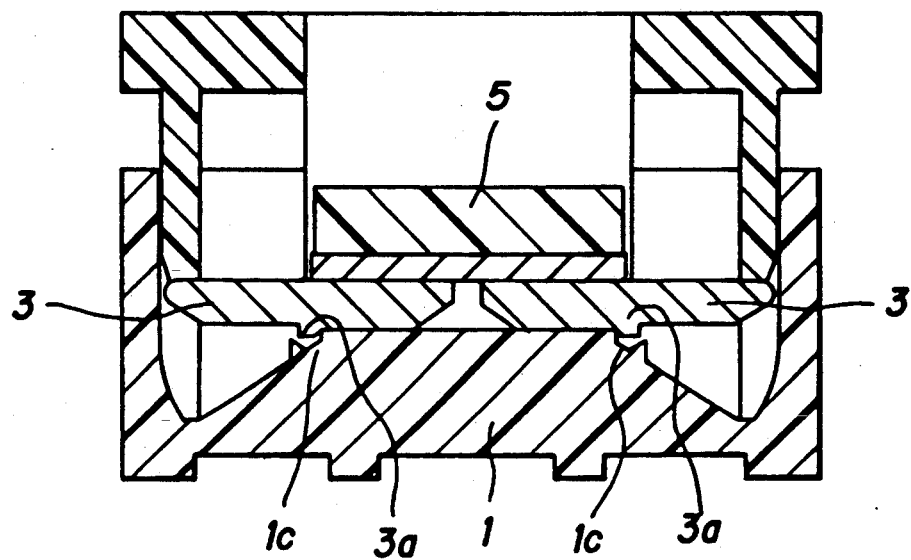
FIG. 9 is a sectional view thereof showing the IC in a contacting state.
Figure 10:
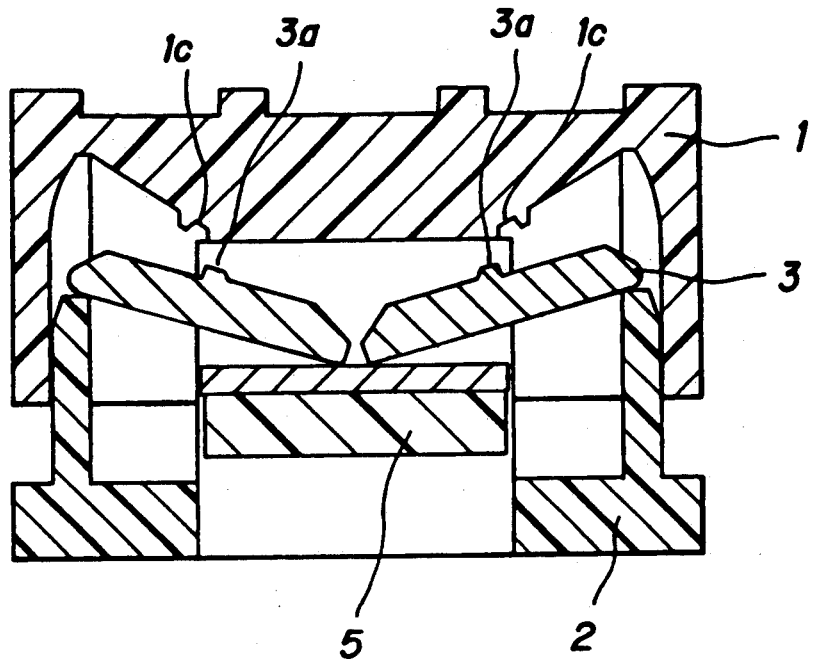
FIGS. 10 and 11 are sectional views of the IC socket respectively showing a displaced state of the lever when the IC socket is placed upside down.
Figure 11:
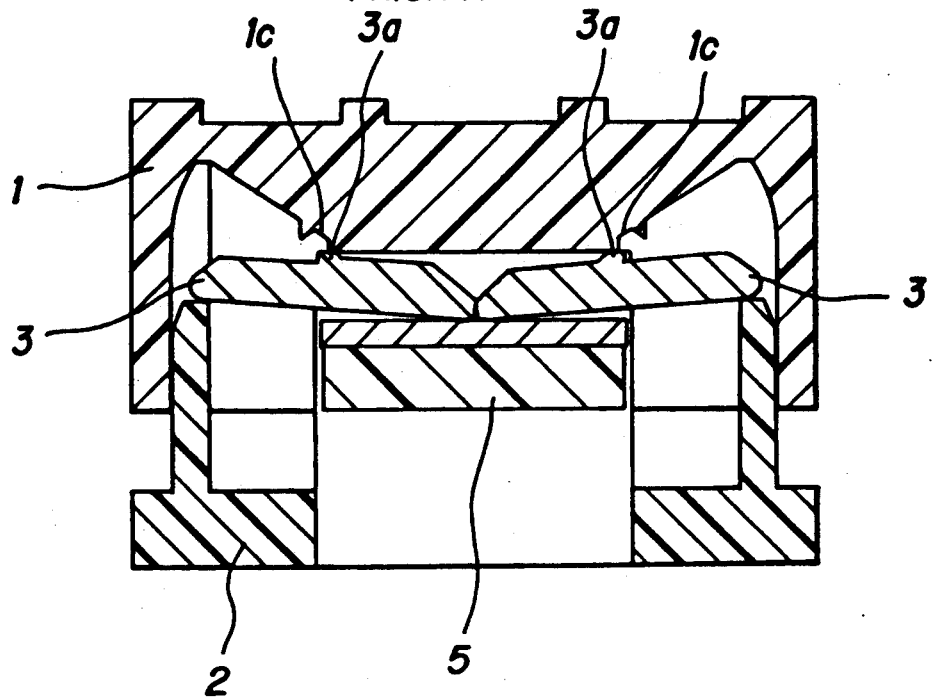

When the IC 5 is pushed up from the foregoing state, the small projection 3d of the push-up lever portions 3b reach the entrance of the cone-shaped concave portions 1d of the socket board 1 (see FIG. 5) and are directly centripetally guided along the inclined surface of the concave portion 1d. As a result, the position of the small projection 3d is corrected (see FIG. 5). In this way, when the IC 5 is pushed into a fixed position as shown in FIG. 7, the leads 5a of the IC 5 are engaged by the contacts 1b of the socket board 1 and contacted. The IC accommodating framework 2, the levers 3 and the IC supporting platform are made ready for an IC removing operation.

In the embodiment, the IC 5 is placed on the IC supporting platform 4 and indirectly pushed up by the lever 3 through the supporting platform 4. Alternatively, it may be designed such that the IC 5 is directly supported and pushed up by the lever 3.

In the foregoing, the directions of movement of the ends of the lever have been referred to in terms of up and down directions, with the socket in the normal upright position as shown in FIGS. 1-3. It will be understood that these directions are reversed when the socket is turned upside down as shown in FIGS. 4-7. Therefore, in the claims, the directions have been recited in terms of the directions in and out of the socket.

As described in the foregoing, according to the present invention, the small projections formed on the lower surface of the push-up portions of the ejection levers are always centripetally guided to the central portion of the cone-shaped inclined surfaces and position indexed guided by the cone-shaped inclined surfaces of the concave portions formed in the socket board. As a result, the correct alignment between the projecting supporting points forming the fulcrums of the ejection levers and the engaging grooves is ensured. Therefore, even if the ejection levers are slightly loose because of the upside down placement of the IC socket, the correct position of the ejection levers can be obtained due to the centripetal function of the cone-shaped concave portions and the small projections. As a result, there can be effectively solved such problems as incorrect alignment of the fulcrums caused by displacement of the ejection levers and insufficient contact of the IC associated therewith.

The preferred embodiment of the present invention has been disclosed for illustrative purposes. Many variations and modifications of the disclosed embodiment are believed to be within the spirit of the invention.

What is claimed is:

1. In an IC socket having a mechanism for ejecting an IC package therefrom, the socket having a socket substrate having an IC package accommodation section for receiving an IC package in an accommodating position when moved from a position outside said accommodation section into said accommodation section, and contact means for contacting terminal means of an IC package when an IC package is in the accommodating position, lever means constituted by a lever pivotally disposed within said socket substrate, said lever having a pivot means thereon and said socket substrate having a pivot means accommodating recess therein in which said pivot means is accommodated during pivoting movement of said lever, said pivot means and socket being positioned intermediate the ends of said lever, the pivoting of said lever being for pushing an IC package out of said accommodating position, said lever having a push-out lever portion and a push-in lever portion, said lever portions being movable alternately out and in around said pivot means as a fulcrum, and said push-out portion extending into said accommodation section for being pushed to an innermost position by an IC package in the accommodating position therein, and push-in means movably mounted on said socket substrate and movable from an outer position to an inner position and engaging the push-in lever portion of said lever for pushing the push-in portion in when said push-in means is pushed in to the inner position, said push-out portion of said lever being moved to an outermost position by pivoting movement of said lever in which it urges an IC package to a position outside said accommodation section, the improvement comprising:

said push-out portion of said lever having a pointed projection and said socket substrate having a conical recess opposed to said pointed projection, said pointed projection and conical recess being positioned for, when said push-out portion is pushed in by the insertion of an IC package into said accommodation section, said pointed projection engages in said conical recess and positions said pivot means for engagement in said pivot means accommodating recess for insuring proper pivoting of said lever.

* * * * *